United States Patent
Farooq et al.

(10) Patent No.: US 8,386,977 B2
(45) Date of Patent: Feb. 26, 2013

(54) CIRCUIT DESIGN CHECKING FOR THREE DIMENSIONAL CHIP TECHNOLOGY

(75) Inventors: Mukta G. Farooq, Hopewell Junction, NY (US); John A. Griesemer, Salt Point, NY (US); William Francis Landers, Wappingers Falls, NY (US); Kevin S. Petrarca, Newburgh, NY (US); Richard Paul Volant, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/113,421

(22) Filed: May 23, 2011

(65) Prior Publication Data

US 2012/0304138 A1    Nov. 29, 2012

(51) Int. Cl.
G06F 9/455 (2006.01)
G06F 17/50 (2006.01)

(52) U.S. Cl. ........ 716/111; 716/106; 716/136; 716/119; 716/51; 716/52

(58) Field of Classification Search ............ 716/50, 716/51, 52, 55
See application file for complete search history.

(56) References Cited

U.S. PATENT DOCUMENTS

| 6,308,143 | B1* | 10/2001 | Segawa | 703/1 |
| 6,891,275 | B2 | 5/2005 | Lane et al. | |
| 7,723,207 | B2 | 5/2010 | Alam et al. | |
| 7,723,230 | B2 | 5/2010 | Setta | |
| 7,749,691 | B2 | 7/2010 | Sekine | |
| 7,772,880 | B2 | 8/2010 | Solomon | |
| 2009/0319968 | A1* | 12/2009 | Wang et al. | 716/5 |

\* cited by examiner

*Primary Examiner* — Thuan Do
*Assistant Examiner* — Brian Ngo
(74) *Attorney, Agent, or Firm* — Jason H. Sosa; H. Daniel Schnurmann (57) ABSTRACT

A tool that allows three dimensional chip circuit designs to be checked subsequent to 3D design layer mirroring. The 3D chip design is converted to a corresponding 2D chip design by mirroring one or more design layers from the mirrored side of a 3D design and merging those design layers with unmirrored design layers from the unmirrored side of a 3D design. The converted circuit design can be processed by standard verification checks. The tool may also receive design layers corresponding to an integrated circuit that will pass through multiple semiconductor chips. Each design cell is examined to determine if it corresponds to a mirrored or unmirrored side of its respective semiconductor chip. If the respective design cell corresponds to the mirrored side, the design cell is mirrored. All mirrored cells are then merged with the unmirrored design cells in the correct order. The merged design is processed by standard verification checks. The tool also has the capability to create terminal metal abstracts for two adjoining chips. One of the abstracts is mirrored and then merged with the other for connectivity and alignment checking.

13 Claims, 6 Drawing Sheets

CIRCUIT DESIGN CHECKING FOR THREE DIMENSIONAL CHIP TECHNOLOGY

BACKGROUND

This disclosure relates generally to three-dimensional integrated circuit design, and more specifically, to converting 3D integrated circuit design images to an equivalent two-dimensional technology design to perform design checks validating intra-chip and inter-chip connections of the original 3D design.

An integrated circuit (IC) is a semiconductor device that includes many electronic components (transistors for example). These components may be interconnected to form multiple circuit components such as gate cells, decoders, and controllers on the IC.

Design engineers design IC's by transforming circuit descriptions of an IC into geometric descriptions called a circuit layout. More specifically, a circuit designer begins by creating a functional block diagram depicting the logic design of the circuit (typically shown as inputs intersecting at "AND", "OR", and "NOR" gates). The functional block diagram is then translated into a schematic. The schematic contains the number and type of various circuit components, represented by distinct symbols, necessary to perform the logic design. The schematic is also typically accompanied by the necessary electrical parameters (i.e., voltage, current, resistance). It is from the schematic that the circuit layout may be designed, for example, by using a computer automated design (CAD) program or other electronic design automation (EDA) applications. In the circuit layout, each circuit component from the schematic is translated into a physical shape and size to form a composite picture of the circuit. A circuit layout may also be referred to as a cell or a design cell. The circuit layout is analogous to a blue print for the circuit. Not every cell needs to be designed from scratch. Many EDA applications have access to Cell Libraries, which have descriptions and layouts that can be used to accomplish various logic designs.

The composite picture shows the circuit in three dimensions as the interconnections of the circuit may traverse multiple layers (this is distinguishable from a three dimensional chip, which will be discussed subsequently). As the building of the three dimensional circuit on a chip takes place one layer at a time, the composite picture is separated into individual layers in the circuit. Each individual layer drawing is then digitized and plotted on an x-y plotting table. Each digitized layer pattern may be used to produce a mask or reticle, or series of masks and/or reticles, to etch and print the layers and corresponding circuit components on semiconductor wafers. The constructed circuit duplicates the circuit layout (design cell). The completed semiconductor devices are now known as chips which may be joined to a carrier on the I/O chip surface. Those skilled in the art will recognize that a "chip" may refer to either a die or a wafer.

The broadly discussed steps of the IC design process may entail various operations. Some of the physical design operations that an EDA tool performs to obtain IC layouts include: (1) floorplanning, which finds the alignment and relative orientation of circuit components; (2) circuit placement; and (3) routing, which completes component interconnects. A completed layout is subject to verification processes, which check the layout to ensure design and functional requirements. Common verification processes include design rule checking (DRC) which determines if the layout satisfies a series of recommended parameters, and layout versus schematic (LVS) which determines whether the layout corresponds to the original schematic. These verification processes may be performed both to the entire composite picture of the circuit layout and to the separated individual layers.

It is upon the completion of the verification processes that the separated individual layer drawings are digitized, plotted, and used for mask creation.

Computer-based tools for creating, editing, analyzing, and checking IC design layouts are based on two dimensional chip technology. "Two-dimensional chip technology" refers to chip fabrication having design shapes (circuits and layers) on only one wafer surface. The circuits on a 2D chip are still in three dimensions.

Three dimensional (3D) chip technologies, on the other hand, incorporate a through silicon via (TSV) that passes through the substrate of an integrated circuit chip. The TSV allows for circuit designs to expand to the front and back wafer surface. Designs on both silicon wafer surfaces allow for one IC chip to join with another IC chip, introducing the concept of stacked chips (hence 3D chip technology). In 3D, the first chip may connect to a carrier at one surface and connect to another chip at the second surface. IC chips may be stacked connecting to chips above and below, and the last chip of such a stack may connect to a heat sink.

Fundamental to 3D technology is that in order to connect a circuit design on one side of a chip to a circuit design on the other side of the chip, one of the circuit designs must be mirrored. Furthermore, as stacked chips may be connected face-to-face, face-to-back, and even back-to-back, where two separate chips connect, one of the connecting sides must mirror the other. Design tools for creating and checking multi-layer designs assume that all designs are on a single surface of a wafer. A typical checking environment provides the designer a top down design view and, again, assumes a single surface design. In current 3D technology, after the circuit layout is designed and verified, the design layers (the separated individual layers of a circuit layout) are mirrored to create new design layers (and ultimately a mirrored circuit layout/design cell). The new design layers are also digitized and turned into masks and/or reticles to create mirrored surfaces on 3D chips. These new design layers are not amenable to verification processes of existing design tools.

SUMMARY

Embodiments of this invention disclose a method and system for checking the integrity of a circuit design for a three dimensional semiconductor chip.

In one embodiment, a first and second design cell is provided, respectively having one or more design layers. A mirror image of the first design cell is then created. Merge the mirror image of the first design cell with the second design cell to convert the circuit design for the three dimensional chip into a corresponding circuit design for a two dimensional chip. Finally, one or more verification processes are performed on the merged mirror image and second design cell.

In another embodiment, one or more design cells from a plurality of semiconductor chips are provided. For each respective design cell it is determined if the respective design cell corresponds to a mirrored side of its respective semiconductor chip, and a mirror image of the design cell is created if it does correspond. All the created mirror images and the unmirrored design cells are merged to form a circuit design spanning multiple semiconductor chips. Verification processes are performed on the merged design cells.

In another embodiment, a first terminal metal abstract layer is created representing, through one or more images, input/output contacts of a first semiconductor chip. A second terminal metal abstract layer is created representing, through one or more images, input/output contacts of a second semiconductor chip. A mirror image of the first metal abstract layer is created and the mirror image is merged with the second terminal metal abstract layer. Alignment and connectivity testing are performed on the merged terminal metal abstract layers.

BRIEF DESCRIPTION OF THE DRAWINGS

The following detailed description, given by way of example and not intended to limit the disclosure solely thereto, will best be appreciated in conjunction with the accompanying drawings, in which.

DETAILED DESCRIPTION

Detailed embodiments of the claimed methods and systems are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

Figure 1:
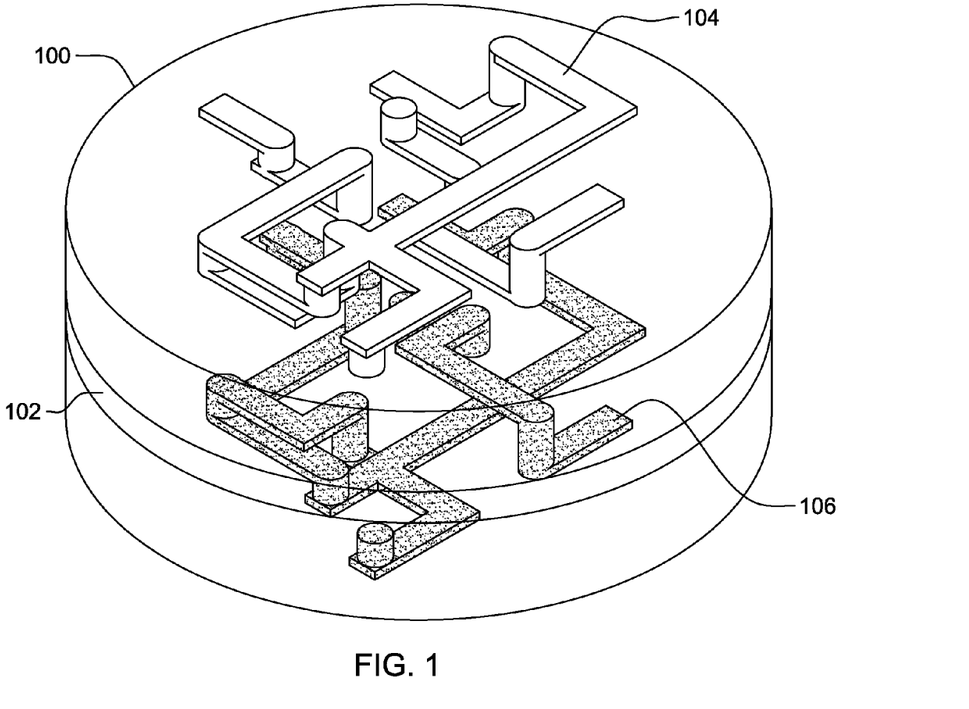
FIG. 1 depicts an exemplary chip comprising an integrated circuit mirrored on both the top and bottom sides of the chip in accordance with an illustrative embodiment of the invention.

FIG. 1 depicts an exemplary chip comprising an integrated circuit mirrored on both the top and bottom sides of the chip in accordance with an illustrative embodiment. Chip 100 represents a wafer or die within which integrated circuits and interconnected devices may be implemented. Chip 100 is composed of semiconductor substrate 102, which is preferably a silicon containing material, a device layer, and one or more metallization layers. Integrated circuit 104 and mirrored integrated circuit 106 are composed of circuit components (i.e., devices in the device layer) and conductive connections between the components (i.e., wiring in the metallization layers).

Integrated circuit 104 is a duplicate of a design cell (circuit layout) created through EDA tools. The design cell is composed of one or more design layers. Similarly, mirrored integrated circuit 106 is a duplicate of a mirrored design cell composed of mirrored design layers (mirror images of the respective design layers from the design cell that integrated circuit 104 duplicates).

Figure 2:
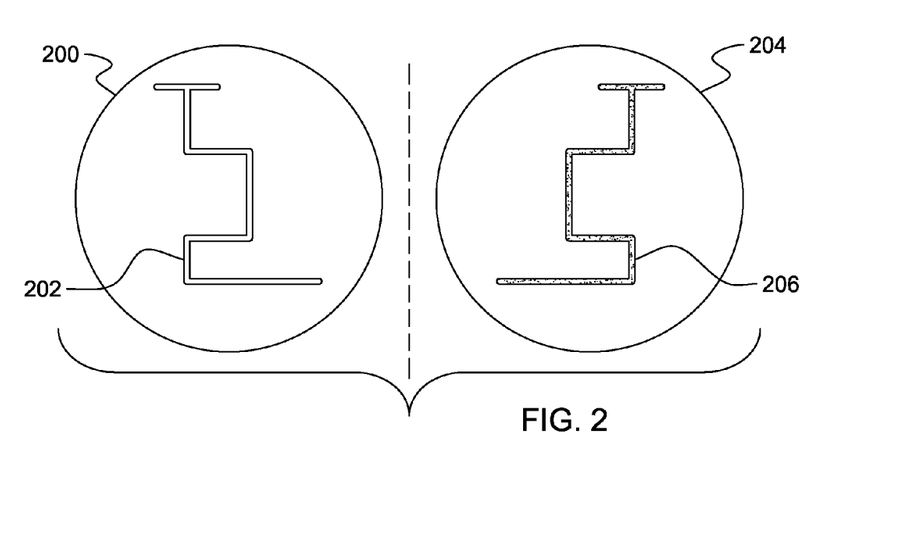
FIG. 2 illustrates a design layer and a mirrored design layer used as reticle designs for opposite sides of a single chip or connecting sides of a first chip and second chip in accordance with an embodiment of the invention.

FIG. 2 illustrates a design layer and a mirrored design layer used as reticle designs for opposite sides of a single chip or connecting sides of a first chip and second chip in accordance with an embodiment of the invention. Design layer 200 represents a single layer of a chip design. Design image 202 shows the part of a design cell located on design layer 200. Design images on consecutive design layers may form a complete design cell. To create a mirror integrated circuit on the opposite side of the chip, the chip is flipped over for the lithography process. Hence, design layer 204 with design image 206 is a mirror of design layer 200. It can be seen that if design layer 200 and design layer 204 were printed on opposite sides of the same chip, design image 202 and design image 206 would line up exactly. Similarly, if design layers 200 and 204 became faces for respective die in a face-to-face join, one chip would be flipped to make the connection and, again, images 202 and 206 would line up exactly.

There are currently no known techniques for design checking or logic checking designs subsequent to design layer mirroring. Such checking would provide assurance of design integrity and help protect against design corruption. Disclosed herein is a method for verifying/checking the design image and design layers of the mirrored circuit layout as integrated with the original circuit layout both intra-chip (from both sides of a single chip) and inter-chip (from one chip to another chip).

Figure 3:
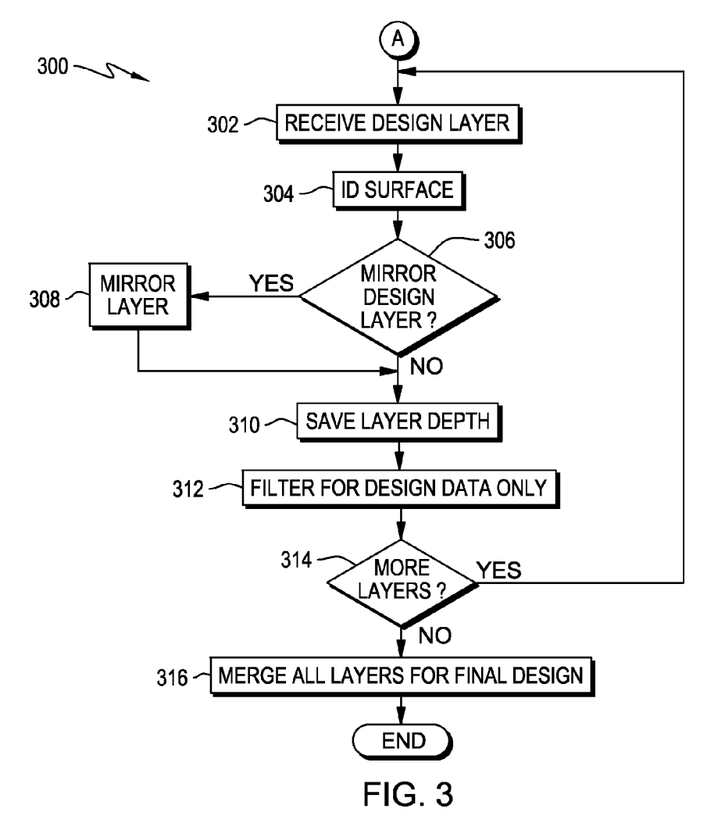
FIG. 3 depicts a flowchart of the steps of get chip design program 300 for gathering, mirroring, and merging all design layers of a chip to produce a complete circuit design in accordance with an illustrative embodiment.

FIG. 3 depicts a flowchart of the steps of get chip design program 300 for gathering, mirroring, and merging all design layers of a chip to produce a complete circuit design in accordance with an illustrative embodiment. A complete circuit design depicts the circuit layout for a design cell and the mirrored design cell from the bottom of a chip through the top. Embodiments of get chip design program 300 are common functions in various embodiments of the invention.

Get chip design program 300 begins by receiving one or more design layers of a chip (step 302). Eventually all design layers of the chip are received, however, in different embodiments, get chip design program 300 may receive anywhere from one layer at a time in one embodiment, up to and including every design layer of an entire design cell in another embodiment.

Get chip design program 300 identifies the surface (the side of the chip) that the layer or layers correspond to (step 304). A chip has surfaces identified as a grind side (also referred to as the bottom or backside) and a device side (also referred to as the top, front, or front side). The top surface of the device side may be referred to as its face and the bottom surface of the grind side may be referred to as its back. In traditional two dimensional chip technologies, integrated circuits are formed on the device side. In three dimensional chip technologies, integrated circuits may be formed on both sides, meaning that there are design layers oriented to different sides.

Decision block 306 makes the determination on whether to mirror the design layer(s) based on the surface identification of step 304. Depending on the type of stacking occurring (i.e., wafer-to-wafer, die-to-wafer, die-to-die, face-to-face, face-to-back, etc.) and the orientation of the chip (bottom chip, middle chip, top chip, etc.), the surface identified for the design layer(s) ultimately determines whether the layer or layers are mirrored.

For example, in a bottom chip it is often the integrated circuit of the grind side that is mirrored, hence any design layer or layers identified as grind side will also be mirrored. However, the device side layers of a second chip in a face-to-face join must mirror device side layers of the first chip to interconnect the chip properly. In this example, the device side design layers of the second chip are mirrored while the grind side design layers of the second chip are not.

Step 308 performs the mirroring process on the layer or layers, as determined by decision block 306.

The mirroring process occurs because current verification technology was designed for two dimensional technology chips and occurs from a top down view. What this means is that for a 2D chip, if the design layers are placed one on top of another, the complete image of the design cell emerges. The design cell and the layer to layer connections may be tested. In three dimensional technology, though all design layers (with design images and mirrored design images) are produced, these layers cannot be merged and tested in this fashion. Referring back to FIG. 2, design layer 200 and its mirror design layer 204 are shown. Yet if we place one layer directly atop another, design images 202 and 206 do not line up. While this is necessary because printing occurs on both sides of a chip, it prevents verification processes. To produce a complete chip design, get chip design program 300 mirrors design layer(s) from the mirrored side of the chip.

One embodiment of the mirroring process includes: defining a mirror axis (the axis around which the coordinates of the design layer will be reversed); set a bounding shape parameter—enclose the shape (design image) preferably in the smallest possible rectangle; and rotate the bounding shape around the axis to produce the reverse coordinates of the shape. In other embodiments, other methods for mirroring the design layer may be used.

Get chip design program 300 saves the depth of the design layer(s) (step 310). In this fashion, get chip design program 300 remembers where each design layer goes in the stack of design layers forming the complete design.

Take for example a design cell having five design layers labeled 1 through 5, with 1 being the innermost layer and 5 being the outermost layer. On the opposite side, the mirrored design cell has mirrored design layers −1 through −5. When printing a circuit corresponding to the first design cell, design layer 1 is printed first. When printing the reverse side, design layer −1 is printed first. However, as each design layer is received by get chip design program 300, design layer −1 is actually at a depth of 6. The design layers range from top to bottom in this example as follows: 5, 4, 3, 2, 1, −1, −2, −3, −4, −5. Technically, these layers can be received in any order as long get chip design program 300 keeps track of the proper depth of each design layer. In an embodiment where get chip design program 300 receives the entire mirrored design cell, the design cell is represented from top down as −5, −4, −3, −2, −1, all the design layers may be mirrored as a single composite image, accomplishing both the mirror of each design layer and the reversal of order to −1, −2, −3, −4, −5, where they will be in the proper order for merging with the non-mirrored design cell.

Get chip design program 300 filters each design layer for design data only (step 312). This step excludes anything from the design layer not relevant to the design cell image.

Decision block 314 determines if there are any layers left to retrieve. If other design layers still exist, get chip design program 300 returns to step 302. When the process has been completed for all design layers in the chip, get chip design program 300 merges all the layers to produce a final design (step 316). This final chip design may be produced as a composite image of the entire circuit layout through the chip and may also maintain characteristics of each design layer. This process and embodiments of this process may be used in various embodiments of the invention.

Figure 4:
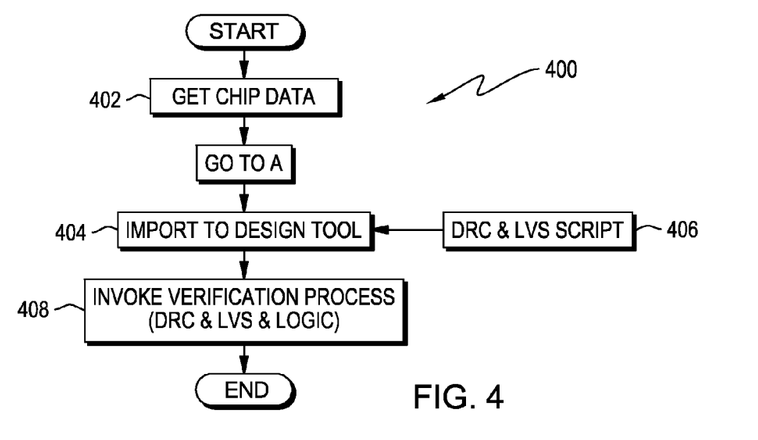
FIG. 4 illustrates a flowchart of the steps of intra-chip check program 400 for performing verification processes on the circuit design of the chip in accordance with an embodiment of the invention.

FIG. 4 illustrates a flowchart of the steps of intra-chip check program 400 for performing verification processes on the circuit design of the chip in accordance with an embodiment of the invention. Intra-chip check program 400 begins by getting the chip design (step 402). To accomplish this, intra-chip check program 400 may go to reference point A to perform the steps of get chip design program 300 of FIG. 3. As a result, intra-chip check program 400 has access to the merged layers of the complete circuit design. Intra-chip check program 400 imports the complete circuit design to a design tool such as an EDA application (step 404). In another embodiment, before importation of the final design, intra-chip check program 400 may mirror the circuit design and then import. Though get chip design program 300 allows for the mirroring of all design layers of one side of the chip, based on the orientation of the chip, the composite of the entire design may be inverted. Intra-chip check program 400 may allow for mirroring to correct such an orientation problem.

The design tool may also import a DRC and/or LVS script or rules (step 406) for the specified design if the design tool does not already have access to them.

Intra-chip check program 400 invokes verification processes (step 408) for the final imported design. Verification processes may include DRC testing, LVS testing, and logic testing, ensuring that design integrity, including for the mirrored design layers, is intact.

Figure 5:
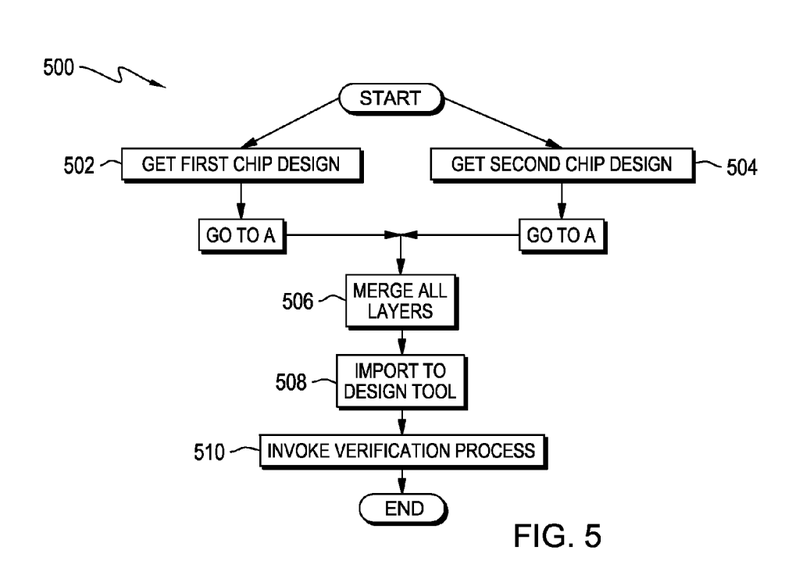
FIG. 5 depicts a flowchart of the steps of inter-chip check program 500 for performing verification processes on the circuit design from one chip to another in accordance with an embodiment of the invention.

Referring now to FIG. 5, a flowchart of the steps of inter-chip check program 500 for performing verification processes on the circuit design from one chip to another is depicted in accordance with an embodiment of the invention. Inter-chip check program 500 begins by getting the first chip design (step 502) and getting the second chip design (step 504). Both of these steps may be accomplished by going to reference point A to perform the steps of get chip design program 300 for each respective chip. It will be understood by those skilled in the art, that this particular embodiment is best suited for checking two 3D chips having design layers on both sides of the chip. It will also be understood by those skilled in the art, that in an embodiment where one of the chips is a two dimensional chip and the other is a three dimensional chip, getting the chip design of the two dimensional chip involves receiving the design cell (and respective design layers) of the chip, without the need to mirror design layers and merge them.

After getting both chip designs, inter-chip check program 500 merges all the design layers from both the first and second chip (step 506). The merged layers may be produced as a composite image of the entire circuit layout through both chips and may also maintain characteristics of each design layer.

Inter-chip check program 500 imports the merged layers to the design tool (508) and ultimately invokes verification processes (step 510) for the entire circuit layout through both chip, including mirrored design layers.

In the depicted embodiment, the electrical connection between the first and second chip is not made through I/O contacts, but instead with a TSV.

Figure 6:
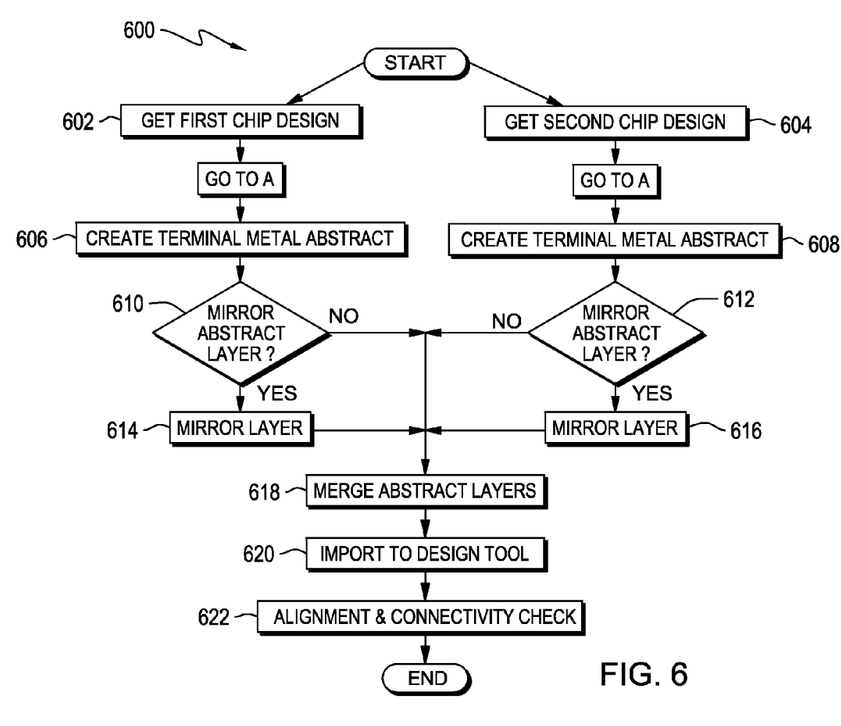
FIG. 6 illustrates a flowchart of the steps of inter-chip connectivity checking program 600 for performing verification processes on connectivity logic from one chip to another and design image alignment in accordance with an embodiment of the invention.

FIG. 6 illustrates a flowchart of the steps of inter-chip connectivity checking program 600 for performing verification processes on connectivity logic from one chip to another and design image alignment in accordance with an embodiment of the invention.

Inter-chip connectivity checking program 600 starts similarly to inter-chip check program 500 by getting a first chip design (step 602) and getting a second chip design (step 604). Based on the chip design, for each respective chip, inter-chip connectivity checking program 600 creates a terminal metal abstract (steps 606 and 608 respectively). A terminal metal abstract may contain an outermost design layer and/or input/output (I/O) design and pin information. The terminal metal abstract satisfies the question of how an integrated circuit connects to power sources and other off-chip connections. The terminal metal abstract may also be referred to as the abstract layer. In another embodiment of the invention, only the design cell from the connecting side of each respective chip is used to create the respective terminal metal abstract.

Because the abstract layers represent surfaces of different chips, one of the abstract layers has to be mirrored so that when comparing the layers, in the traditional two dimensional technology views, the two abstract layers correctly line up. Decision blocks 610 and 612 make this determination for the first and second chip respectively based on which chip is being flipped and which sides are mirrored.

Inter-chip connectivity checking program 600 mirrors the abstract layer in either step 614 or step 616 depending on its determinations in decision blocks 610 and 612 respectively. Inter-chip connectivity checking program 600 merges the abstract layers (step 618).

Inter-chip connectivity checking program 600 imports the abstract layers to the design tool (step 620) where alignment and connectivity checking (step 622) may take place. These tests are known in the art and may include: confirmation that I/O ports are connected to the design cell (per two dimensional technology criteria); confirmation of connectivity logic between abstract layers; and chip to chip alignment testing.

Figure 7:
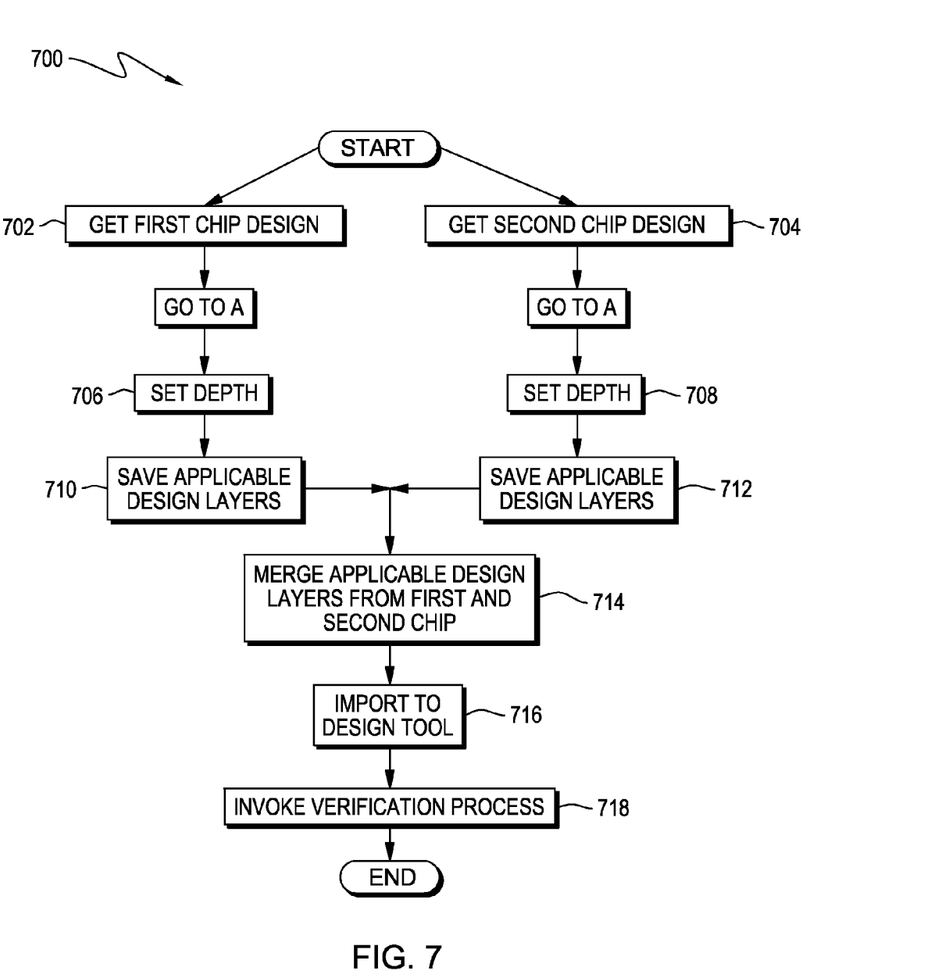
FIG. 7 depicts a flowchart of the steps of inter-chip design cell checking program 700 for performing verification processes on a design cell spanning two chips in accordance with an illustrative embodiment.

FIG. 7 depicts a flowchart of the steps of inter-chip design cell checking program 700 for performing verification processes on a design cell spanning two chips in accordance with an illustrative embodiment. Consider the case of a ring oscillator, where the ring stages are connected by TSVs in a 3D die, but the stage devices are in a separate die (which could be two dimensional or three dimensional). In such a case, the circuit would move from one die to the next and then back again. The design cell for such a circuit would actually expand into the second chip by one or more design layers.

As a starting point, inter-chip design cell checking program 700 may get a first chip design (step 702) and a second chip design (step 704). This may be accomplished by the steps of get chip design 300 starting at reference point A.

For each chip design, a depth is set (steps 706 and 708, respectively). Recall that in get chip design program 300, all the design layers are correctly put together and the depth of each layer is saved. In one embodiment, the bottom chip (be it the first chip or second chip) sets the depth to include the whole design with all design layers. In another embodiment, the depth may be set to only include the top side design layers. In yet another embodiment, inter-chip design cell checking program 700 may receive the depth from a user of the program. The top chip, in a preferred embodiment, will set the depth only to include the design layers that complete the design cell from the bottom chip. In another embodiment, again, inter-chip design cell checking program 700 receives the depth from a user.

Inter-chip design cell checking program 700 saves the applicable design layers (step 710 and 712, respectively) as determined by the set depth. As an example, applicable design layers may include all the layers from the bottom chip and an outermost design layer from the top chip. All applicable layers are preferably already correctly mirrored in the steps of get chip design program 300. In another embodiment, design layer mirroring may take place after applicable design layers have been selected.

Inter-chip design cell checking program 700 merges all applicable design layers from both chip (step 714) to form a complete design cell spanning both chips, with respective design layers, which may be tested by traditional two dimensional verification technologies. The design is imported to the design tool (step 716) and verification processes are invoked (step 718).

Figure 8:
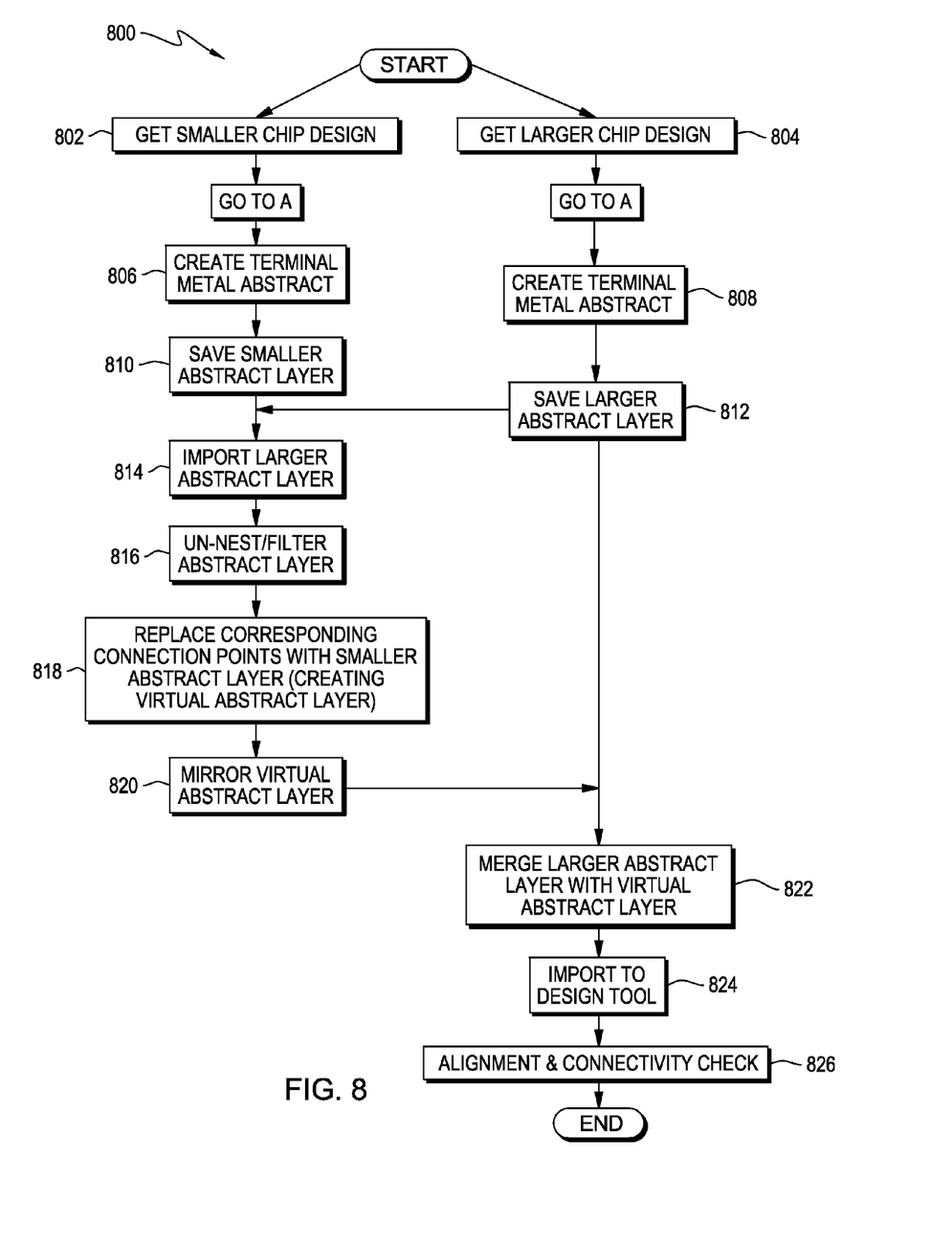
FIG. 8 illustrates a flowchart of the steps of mismatched inter-chip connectivity checking program 800 for performing verification processes on the connectivity and alignment of two chips where the chip surfaces differ in dimensions in accordance with an embodiment of the invention.

FIG. 8 illustrates a flowchart of the steps of mismatched inter-chip connectivity checking program 800 for performing verification processes on the connectivity and alignment of two chips where the chip surfaces differ in dimensions in accordance with an embodiment of the invention. This may occur, for example, in a die-to-wafer bond.

Mismatched inter-chip connectivity checking program 800 begins the same way as inter-chip connectivity checking program 600, by getting a first and second chip design, in this case, where one is smaller and one is larger (steps 802 and 804, respectively) and creating a terminal metal abstract for each (steps 806 and 808). Mismatched inter-chip connectivity checking program 800 then saves the smaller abstract layer (step 810) and the larger abstract layer (step 812) for future use/manipulation.

Mismatched inter-chip connectivity checking program 800 creates a copy of the larger abstract layer (step 814). Mismatched inter-chip connectivity checking program 800 unnests and filters the copy of the larger abstract layer (step 816). This means that all I/O contact ports and pins, etc. are removed except for the ones corresponding to the design layer that corresponds to the design cell of the smaller chip.

Mismatched inter-chip connectivity checking program 800 replaces the corresponding conduction points on the filtered copy of the larger abstract layer, with the smaller abstract layer (step 818) which creates a virtual abstract layer of the same dimensions of the larger abstract layer and includes smaller abstract layer embedded in its proper orientation.

Mismatched inter-chip connectivity checking program 800 mirrors the virtual abstract layer (step 820) and merges the larger abstract layer and the virtual abstract layer (step 822), which should now line up properly in a two dimensional technology view.

Mismatched inter-chip connectivity checking program 800 imports the layers to the design tool (step 824) and performs alignment and connectivity checks (step 826).

Figure 9:
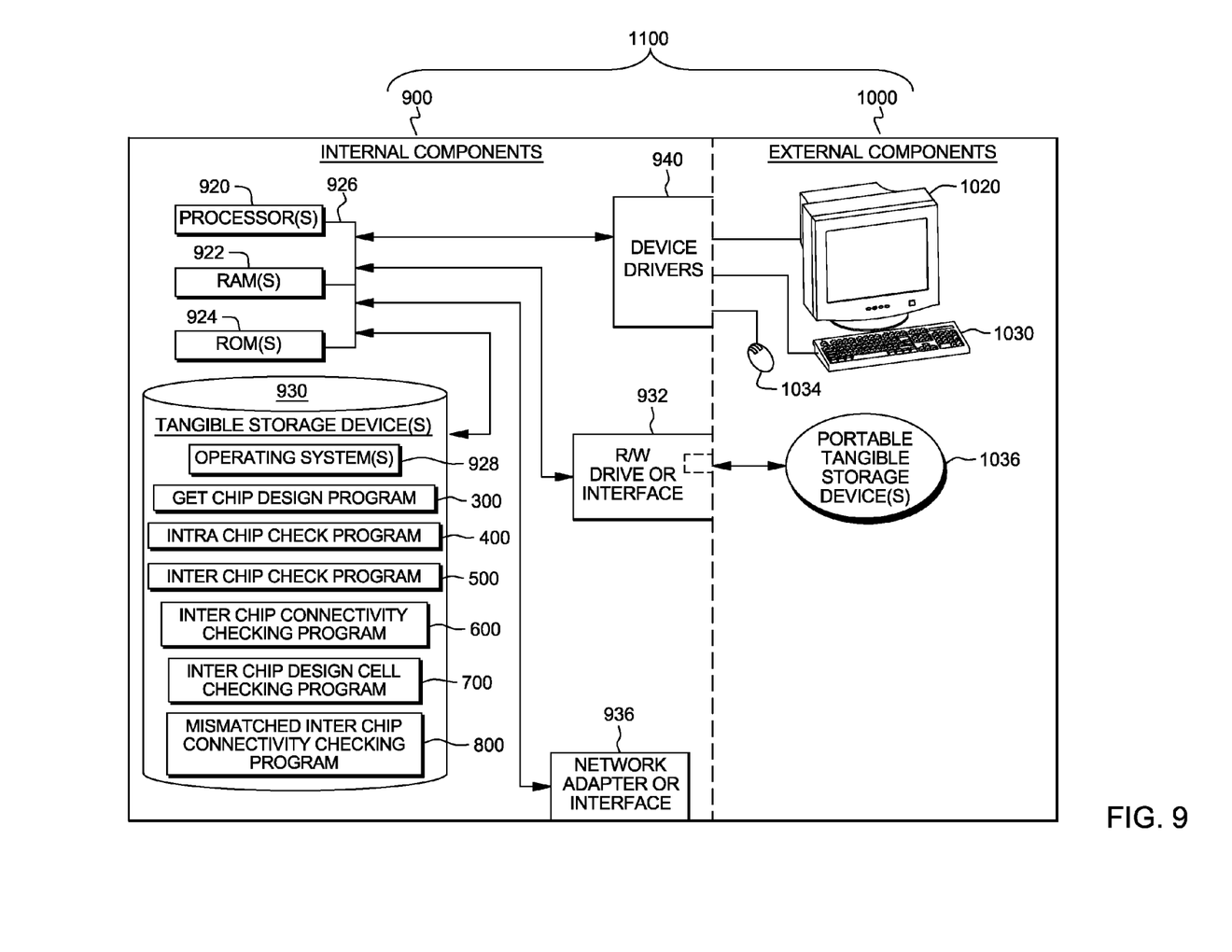
FIG. 9 depicts an exemplary data processing system in which embodiments of the present invention may be performed.

FIG. 9 depicts a data processing system in which embodiments of the present invention may be performed. Data processing system 1100 may be any computer system or device such as a client computer system, a server computer system, a notebook, a laptop computer, a tablet computer, a handheld device or smart-phone, a thin client, or any other electronic device or computing system capable of performing the process steps of get chip design program 300, intra-chip check program 400, inter-chip check program 500, inter-chip connectivity checking program 600, inter-chip design cell checking program 700, and mismatched inter-chip connectivity checking program 800.

Data processing system 1100 maintains internal components 900 and external components 1000. FIG. 9 is intended as an example, and not as an architectural limitation for the different embodiments.

Internal components 900 include one or more processors 920, one or more computer-readable RAMs 922 and one or more computer-readable ROMs 924 on one or more buses 926, and one or more operating systems 928 and one or more computer-readable tangible storage devices 930. The one or more operating systems 928, as well as get chip design program 300, intra-chip check program 400, inter-chip check program 500, inter-chip connectivity checking program 600, inter-chip design cell checking program 700, and mismatched inter-chip connectivity checking program 800, and any other programs for data processing system 1100, are stored on one or more of the respective computer-readable tangible storage devices 930 for execution by one or more of the respective processors 920 via one or more of the respective RAMs 922 (which typically include cache memory). In another embodiment, one or more of the respective program embodiments may be stored on the one or more ROMs 924. In the embodiment illustrated in FIG. 9, each of the computer-readable tangible storage devices 930 is a magnetic disk storage device of an internal hard drive. Alternatively, one or more of the computer-readable tangible storage devices 930 is a semiconductor storage device such as ROM 824, EPROM, flash memory, or any other computer-readable tangible storage device that can store a computer program and digital information.

Each set of internal components 900 also includes a R/W drive or interface 932 to read from and write to one or more portable computer-readable tangible storage devices 1036 such as a CD-ROM, DVD, memory stick, magnetic tape, magnetic disk, optical disk or semiconductor storage device. Get chip design program 300, intra-chip check program 400, inter-chip check program 500, inter-chip connectivity checking program 600, inter-chip design cell checking program 700, and mismatched inter-chip connectivity checking program 800 can be stored on one or more of the respective portable computer-readable tangible storage devices 1036, read via the respective R/W drive or interface 932 and loaded into hard drive 930.

Internal components 900 also include a network adapter or interface 936 such as a TCP/IP adapter card. The respective program embodiments of the invention can be downloaded to the respective computers from an external computer via a network (not shown) and network adapter or interface 936. From the network adapter or interface 936, the respective program embodiments are loaded into the hard drive 930. The network may comprise copper wires, optical fibers, wireless transmission, routers, firewalls, switches, gateway computers and/or edge servers.

Alternatively, data processing system 1100 may be a server computer system, and a client computer system (not shown) may access the functionality of the respective program embodiments stored on hard drive 930 via network adapter or interface 936.

External components 1000 include a computer display monitor 1020, a keyboard 1030, and a computer mouse 1034. Internal components 900 also include device drivers 940 to interface to computer display monitor 1020, keyboard 1030 and computer mouse 1034. Device drivers 940, R/W drive or interface 932 and network adapter or interface 936 comprise hardware and software (stored in storage device 930 and/or ROM 924).

Get chip design program 300, intra-chip check program 400, inter-chip check program 500, inter-chip connectivity checking program 600, inter-chip design cell checking program 700, and mismatched inter-chip connectivity checking program 800 can be written in various programming languages (such as Java, C++) including low-level, high-level, object-oriented or non object-oriented languages. Alternatively, the functions of the respective program embodiments can be implemented in whole or in part by computer circuits and other hardware (not shown).

In general, the routines executed to implement the embodiments of the invention, may be part of an operating system or a specific application, component, program, module, object, or sequence of instructions. The computer program(s) of the present invention typically is comprised of a multitude of instructions that will be translated by the native computer into a machine-readable format and hence executable instructions. Also, programs are comprised of variables and data structures that either reside locally to the program or are found in memory (RAM(S) 922) or on storage devices (tangible storage devices 930). In addition, the various programs described above may be identified based upon the application for which they are implemented in a specific embodiment of the invention. However, it should be appreciated that any particular program nomenclature that occurs is used merely for convenience, and thus the invention should not be limited to use solely in any specific application identified and/or implied by such nomenclature.

The terminology used herein is for the purpose of describing particular embodiments only and is not intended to be limiting of the invention. As used herein, the singular forms "a", "an" and "the" are intended to include the plural forms as well, unless the context clearly indicates otherwise.

Having described preferred embodiments of a three dimensional chip design verification tool (which are intended to be illustrative and not limiting), it is noted that modifications and variations may be made by persons skilled in the art in light of the above teachings. For example, many of the disclosed embodiments describe verification processes taking place between two chips, however, other embodiments which include three or more chips bonded together are contemplated and included by the invention. In addition, embodiments herein often refer to importing converted designs/layers to the design tool, however, it is to be understood that these programs may actually be part of such a tool, in which case no importation would be necessary. It is therefore to be understood that changes may be made in the particular embodiments disclosed which are within the scope of the invention as outlined by the appended claims.

What is claimed is:

1. A method for checking integrity of a circuit design for an integrated circuit passing through a first and second semiconductor chip, the first semiconductor chip having larger surface dimensions than the second semiconductor chip, the method comprising:

determining a design cell to be mirrored from either a design cell of the first semiconductor chip or a corresponding design cell from the second semiconductor chip;

setting a bounding shape parameter around elements of the determined design cell corresponding to the integrated circuit;

defining an axis around which coordinates of the determined design cell can be reversed;

rotating the elements within the bounding shape parameter around the axis to produce reverse coordinates of the elements corresponding to the integrated circuit;

merging the design cell and the corresponding design cell such that the merged design cells represent the integrated circuit passing through the first and second semiconductor chips when stacked;

creating a virtual metal abstract layer having dimensions of a terminal metal abstract layer of the first semiconductor chip and images from a terminal metal abstract layer of the second semiconductor chip; and merging the virtual metal abstract layer and the terminal metal abstract layer of the first semiconductor chip wherein the merged metal abstract layers depict connecting contacts of the first and second semiconductor chips when stacked performing one or more verification processes on the merged design cells.

2. The method of claim 1, wherein the first semiconductor chip is a two dimensional semiconductor chip and the second semiconductor chip is a three dimensional semiconductor chip.

3. The method of claim 1, wherein the first semiconductor chip is a wafer and the second semiconductor chip is a die.

4. The method of claim 1, wherein said creating the virtual metal abstract layer comprises:

creating a mirror image of the terminal metal abstract layer of the first semiconductor chip;

removing images, on the mirror image, not corresponding to the integrated circuit passing through the first and second semiconductor chips; and replacing remaining images on the mirror image with images from the terminal metal abstract layer of the second semiconductor chip.

5. The method of claim 1, further comprising:

prior to merging the virtual metal abstract layer and the terminal metal abstract layer of the first semiconductor chip, mirroring one of either the virtual metal abstract layer or the terminal metal abstract layer of the first semiconductor chip.

6. The method of claim 1, further comprising performing one or more verification processes on the merged metal abstract layers.

7. The method of claim 1, further comprising:

based on the design cell from the first semiconductor chip, creating the terminal metal abstract layer for the first semiconductor chip; and based on the corresponding design cell from the second semiconductor chip, creating the terminal metal abstract layer for the second semiconductor chip.

8. The method of claim 1, wherein each of the design cell on the first semiconductor chip and the corresponding design cell on the second semiconductor chip have a plurality of design layers.

9. The method of claim 6, wherein at least one of the one or more verification processes is selected from the group consisting of design rule checking, layout versus schematic, connectivity testing, and alignment testing.

10. The method of claim 1, further comprising, prior to determining the design cell to be mirrored from either the design cell of the first semiconductor chip or the corresponding design cell from the second semiconductor chip, receiving the design cell and the corresponding design cell; and determining which of the design cell or the corresponding design cell corresponds to circuitry on a mirrored side of a semiconductor chip.

11. The method of claim 8, further comprising filtering each respective design layer from the plurality of design layers, for each of the design cell and the corresponding design cell, to remove any data not corresponding to the integrated circuit.

12. A computer program product comprising one or more computer-readable tangible storage devices and program instructions which are stored on the one or more computer-readable tangible storage devices and when executed by one or more processors perform the method of claim 1.

13. A computer system comprising one or more processors, one or more computer-readable memories, one or more computer-readable tangible storage devices and program instructions which are stored on the one or more computer-readable tangible storage devices for execution by the one or more processors via the one or more memories and when executed by the one or more processors perform the method of claim 1.

* * * * *